United States Patent
Chung

(10) Patent No.: US 10,310,976 B2
(45) Date of Patent: Jun. 4, 2019

(54) SYSTEM AND METHOD FOR CONCURRENTLY CHECKING AVAILABILITY OF DATA IN EXTENDING MEMORIES

(71) Applicant: Taiwan Semiconductor Manufacturing Company, Ltd., Hsin-Chu (TW)

(72) Inventor: Shine Chung, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 60 days.

(21) Appl. No.: 14/835,988

(22) Filed: Aug. 26, 2015

(65) Prior Publication Data

US 2015/0363314 A1 Dec. 17, 2015

Related U.S. Application Data

(63) Continuation of application No. 11/724,568, filed on Mar. 15, 2007, now abandoned.

(51) Int. Cl.
*G06F 3/06* (2006.01)
*H01L 25/065* (2006.01)
(Continued)

(52) U.S. Cl.
CPC .......... *G06F 12/0811* (2013.01); *G06F 3/064* (2013.01); *G06F 3/0613* (2013.01);
(Continued)

(58) Field of Classification Search
None
See application file for complete search history.

(56) References Cited

U.S. PATENT DOCUMENTS 5,276,826 A * 1/1994 Rau ..................... G06F 12/0607
710/60
5,649,154 A 7/1997 Kumar et al.
(Continued)

OTHER PUBLICATIONS

B. Black et al., "Die Stacking (3D) Microarchitecture," 2006 39th Annual IEEE/ACM International Symposium on Microarchitecture (MICRO'06), Orlando, FL, 2006, pp. 469-479. (Year: 2006).*
(Continued)

*Primary Examiner* — Edward J Dudek, Jr.
*Assistant Examiner* — Ralph A Verderamo, III
(74) *Attorney, Agent, or Firm* — Haynes and Boone, LLP

(57) ABSTRACT

A memory system for use in a system-in-package device (SiP) is disclosed. The memory system includes two cache memories. The first cache memory is on a first die of the SiP and the second cache memory is on a second die of the SiP. Both cache memories include tag random access memories (RAMs) corresponding to data stored in the corresponding cache memories. The second cache memory is of a different cache level from the first cache memories. Also, the first cache memory is on a first die of the SiP, and the second cache memory includes a first portion on the first die of the SiP, and a second portion on a second die of the SiP. Both cache memories can be checked concurrently for data availability by a single physical address.

20 Claims, 6 Drawing Sheets

(51) Int. Cl.
*G06F 12/0811* (2016.01)
*G06F 12/0846* (2016.01)
*G06F 12/0864* (2016.01)

(52) U.S. Cl.
CPC ........ *G06F 3/0683* (2013.01); *G06F 12/0846* (2013.01); *G06F 12/0864* (2013.01); *G06F 2212/1016* (2013.01); *G06F 2212/1021* (2013.01); *G06F 2212/451* (2013.01); *H01L 25/0652* (2013.01); *H01L 25/0655* (2013.01); *H01L 25/0657* (2013.01); *H01L 2224/48091* (2013.01); *H01L 2224/48145* (2013.01)

(56) References Cited

U.S. PATENT DOCUMENTS

| | | | |
|---|---|---|---|
| 5,678,020 A * | 10/1997 | Singh | G06F 12/0897 711/100 |
| 5,903,908 A | 5/1999 | Singh et al. | |
| 6,282,614 B1 | 8/2001 | Musoll | |
| 6,397,296 B1 * | 5/2002 | Werner | G06F 9/3802 711/119 |
| 6,412,038 B1 | 6/2002 | Mehalel | |
| 6,427,188 B1 * | 7/2002 | Lyon | G06F 12/0864 711/122 |
| 6,430,655 B1 * | 8/2002 | Courtright | G06F 12/0802 711/118 |
| 6,848,031 B2 | 1/2005 | Jourdan | |
| 2003/0154345 A1 | 8/2003 | Lyon | |
| 2004/0098540 A1 | 5/2004 | Itoh et al. | |
| 2004/0162971 A1 | 8/2004 | Joy et al. | |
| 2004/0268048 A1 * | 12/2004 | Homewood | G06F 12/0846 711/120 |
| 2005/0033920 A1 | 2/2005 | DeLan | |

OTHER PUBLICATIONS

"Chapter 7 Large and Fast: Exploiting Memory Hierarchy." in: David A. Patterson and John L. Hennessy, Computer Organization and Design, 3rd Edition (Elsevier, 2005), pp. 466-561. (Year: 2005).*

Bryan Black et al., "Die Stacking (3D) Microarchitecture," 2006, IEEE Computer Society, Proceedings of the 39th Annual IEEE/ACM International Symposium on Microarchitecture, pp. 469-479.

* cited by examiner

SYSTEM AND METHOD FOR CONCURRENTLY CHECKING AVAILABILITY OF DATA IN EXTENDING MEMORIES This is a continuation of U.S. Ser. No. 11/724,568 filed Mar. 15, 2007, the entire disclosure of which is hereby incorporated by reference. This invention relates generally to computer memory architectures, and, more particularly, to a system and method for extending memories in stacked chips with multicore microprocessors.

BACKGROUND

A recent trend to pack more functions into a small form factor is a so-called system-in-package (SiP) technology which is to enclose a number of integrated circuit (IC) dies in a single package or module. The dies may be stacked vertically or placed horizontally alongside one another inside the package. They are internally connected by fine wires that are buried in the package, or joined by solder bumps through a flip-chip technology. FIGS. 1A and 1B illustrate such SiP devices. Referring to FIG. 1A, there are two core dies 110 and 120 mounted on top of a package substrate 100. The core dies contain processing units as well as memories serving as Level 1 caches to the processing units. On top of the core dies 110 and 120, an additional SiP memory 130 is also mounted to serve as Level 2 cache to the dual processing units or cores.

Referring to FIG. 1B, beside the dual cores 110 and 120, and the SiP memory 130, there is another memory die 140 mounted on the same layer as the dual cores 110 and 120. In this case, as the memory die 140 is located closer to the dual cores 110 and 120 than the SiP memory 130, memory die 140 may serve as a Level 2 cache, and then the SiP memory 130 may serve as a Level 3 cache.

These SiPs can greatly extend cache capacity in a computer system. But with added levels of caches, memory management becomes more complicated. FIG. 2 shows how a microprocessor executes data. In this computer system, a memory hierarchy 200 includes a hard drive 210, a main memory 220, Level 2 caches 230, Level 1 caches 242 and a register file 244, which is closest to an execution unit 246 (Arithmetic-Logic Unit or ALU, for example). The main memory 220 is typically comprised of dynamic random access memory (DRAM). The caches 230 and 242 are smaller, faster memories and usually made of static random access memory (SRAM) that store copies of the data from the most frequently used main memory locations. Moreover, the Level 1 cache 242, the register file 244 and the execution unit 246 reside usually in the same central processing unit (CPU) die 240. Data are fetched through the memory hierarchy 200 from the hard drive 210, the main memory 220, the caches 230 and 242, and the register file 244 to the execution unit 246 for processing. Data storage tends to be a subset of another storage device farther away from execution unit 246. The farther the storage devices are away from the execution unit 246, the larger the capacities, the slower the speed, and the narrower the bandwidth. This pyramid scheme works to compromise speed versus capacity based on temporal and spatial localities, namely data blocks used now will be used later; data blocks used here will be used in close proximity later. This memory hierarchy 200 is applied to instructions as well as data for caches, main memory and disk storage. For the lowest level cache, instruction and data caches tend to be separate entities (separate caches). Otherwise they are stored in the same storage (unified cache) for other levels of caches. The memory hierarchy 200 is a commonly used technique in the computer art to achieve high performance while reducing costs.

Cache memories work like temporary storages. When the processing unit 246 wishes to read or write to a location in the main memory 220, it first checks whether that memory location is in the Level 1 cache 242. This is accomplished by comparing the address of the memory location to all tags stored in the Level 1 cache 242 that might contain that address. If the processing unit 246 finds that the memory location is in the cache, then the data corresponding to the address will be accessed directly from the Level 1 cache 242, and a cache hit will have occurred. Otherwise the data is not in the Level 1 cache 242, and it is a cache miss.

SiP extends computer cache capacity; however, with the aforementioned hierarchical memory management approach, the Level 2 cache 230 cannot be simultaneously checked with the Level 1 cache 242. The execution unit 246 can only check the Level 1 cache 242 directly. For Data to be accessed, they have to be transferred to the lower memories in the hierarchy. This lowers memory management efficiency.

As such, what is desired is a memory management system and method that can simultaneously check multiple memories either in the same or different levels, and hence directly accesses data stored in those memories.

SUMMARY

A memory system for use in a system-in-package device (SiP) is disclosed. The memory system includes two cache memories. The first cache memory is on a first die of the SiP and the second cache memory is on a second die of the SiP. Both cache memories include tag random access memories (RAMs) corresponding to data stored in the corresponding cache memories. The second cache memory is of a different cache level from the first cache memories. Also, the first cache memory is on a first die of the SiP, and the second cache memory includes a first portion on the first die of the SiP, and a second portion on a second die of the SiP. Both cache memories can be checked concurrently for data availability by a single physical address.

The construction and method of operation of the memory system, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present disclosure describes a memory management system and method that can simultaneously check multiple caches either in the same level or in different levels, and hence directly accesses data stored in the caches.

Figure 1A:
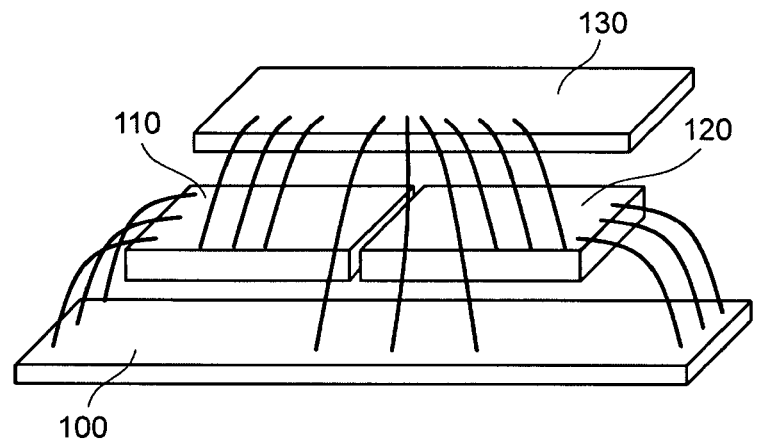
FIGS. 1A and 1B illustrate cache memory being extended in conventional system-in-package (SiP).
Figure 1B:
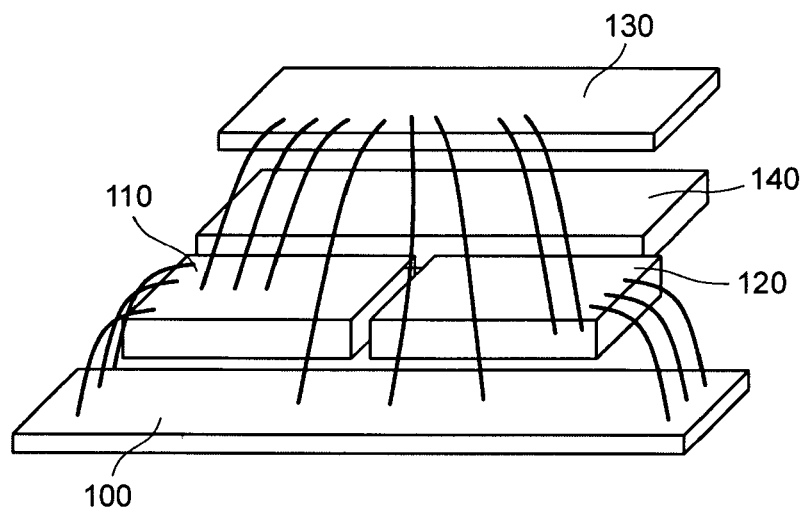
Figure 2:
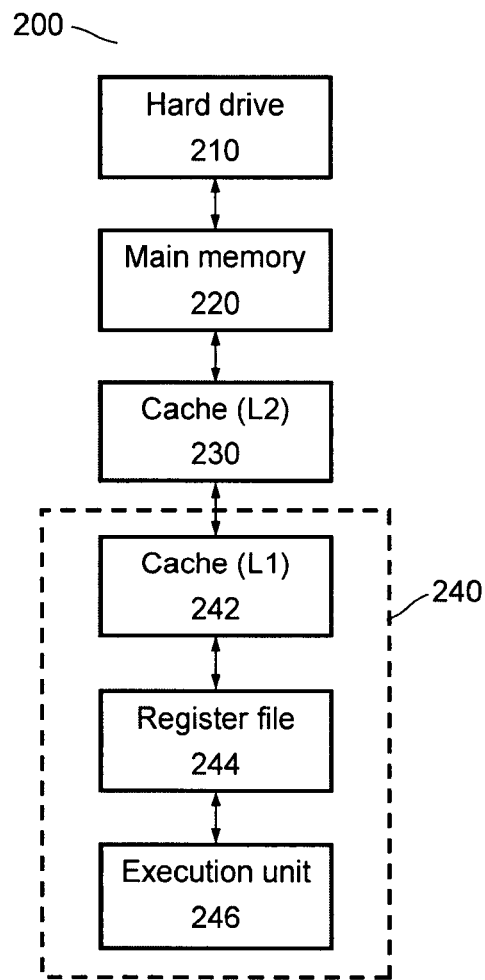
FIG. 2 illustrates a conventional memory hierarchy.
Figure 3:
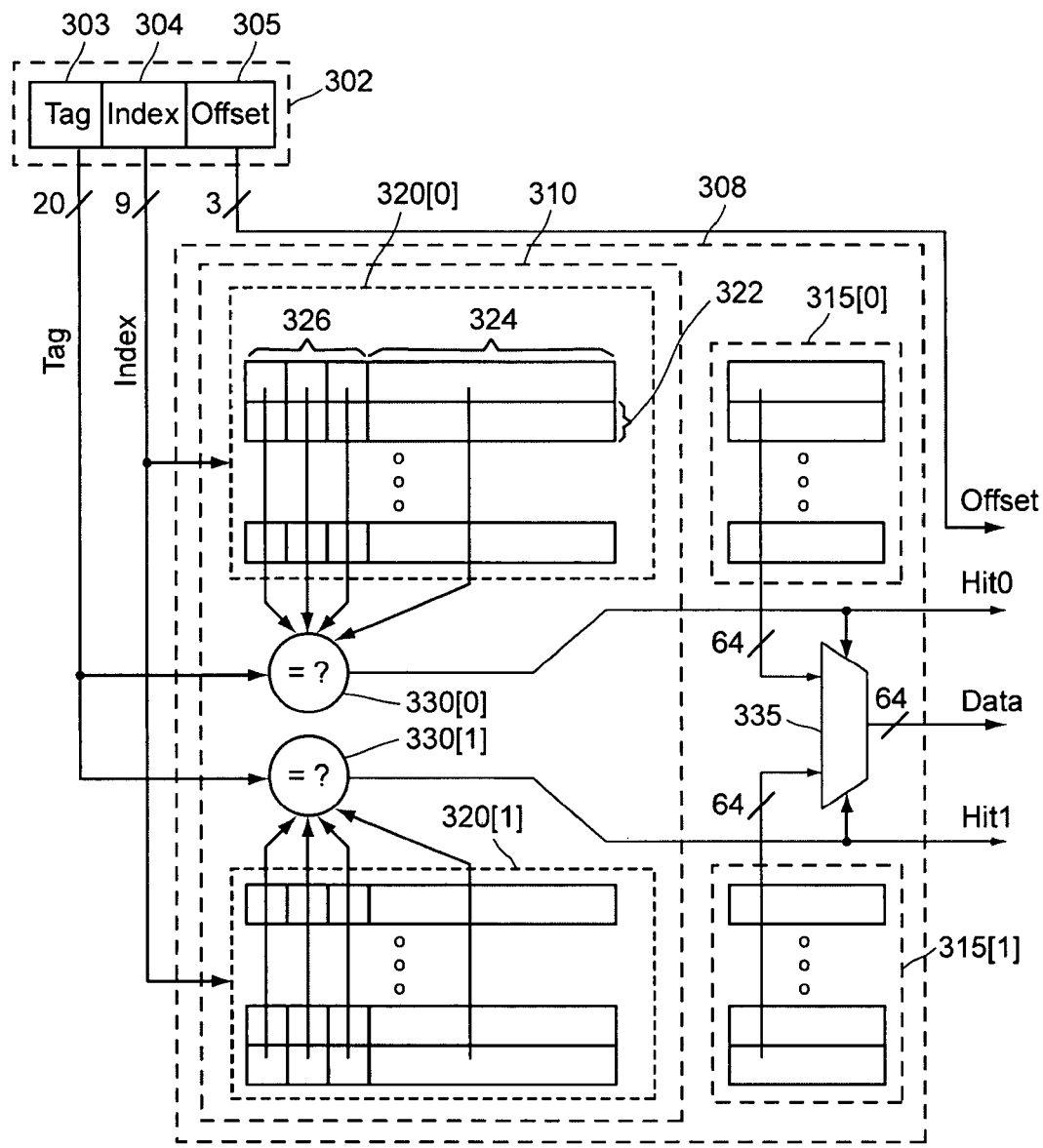
FIG. 3 is a block diagram illustrating a conventional cache accessing mechanism.

FIG. 3 is a block diagram illustrating a conventional cache accessing mechanism. Supposing a computer's physical address 302 has 32 bits, and they are divided into 20 tag bits 303, 9 index bits 304 and 3 offset bits 305. A cache 308 has a tag random access memory (RAM) 310, and a data RAM 315, where actual data are stored. The tag RAM 310 has a plurality of tag lines 322, each store a tag 324 along with its attribute bits 326 for cache coherence operations. The attribute bits 326 may contain 4 bits, i.e., a modified bit, an exclusive bit, a share bit and an invalidate bit. The offset 305 has 3 bits indicating that a cache line 320 has 8 bytes (2 3=8). When a data is stored in the cache 308, its corresponding tag is then stored in the tag RAM 310. The index bits 304 in the physical address 302 are used to address the tag lines 320 of the tag RAM 310. 9 bits can address a tag RAM with 512 lines (2 9=512).

When the physical address 302 is checked against the cache 308, the 9 index bits 304 are used to select a tag line 322 in the tag RAM 310. First is to check the attribute bits 324 of the selected tag line by a block 330. The modified bit may indicate whether this line of data has been modified or not and determines any line update when it is swapped back to a hard disk. Any match result may be ignored if the invalidate bit is set. The block 330 may be implemented as a multi-bit comparator circuit. After all the attribute bits are checked, the output of the tag portion may be compared with the tag bits 303 of the physical address 302 also at the block 330. If the comparison produces a match, then a chunk of data the physical address 302 intends to address is stored in the cache 308 and can be fetched directly, i.e., a cache hit has occurred.

In fact, the cache 308 illustrated in FIG. 3 has two sets of identical tag RAMs 320[0:1] and data RAMs 315[0:1] as well as two identical blocks 330[0:1] as in a two-way set associated cache configuration. Both of the tag RAMs 330[0:1] are checked against a physical address at the same time. Since all data stored in the cache 308 have unique locations, and their tags are unique, there is only one block 330 that can produce a match at a time. If the block 330[0] produces a match, then a signal Hit0 may be set, which may select data from the data RAM 315[0] to output from a multiplexer 335. Similarly, if the block 330[1] produces a match, then a signal Hit1 may be set, which may select data from the data RAM 315[1] to output from the multiplexer 335.

Figure 4:
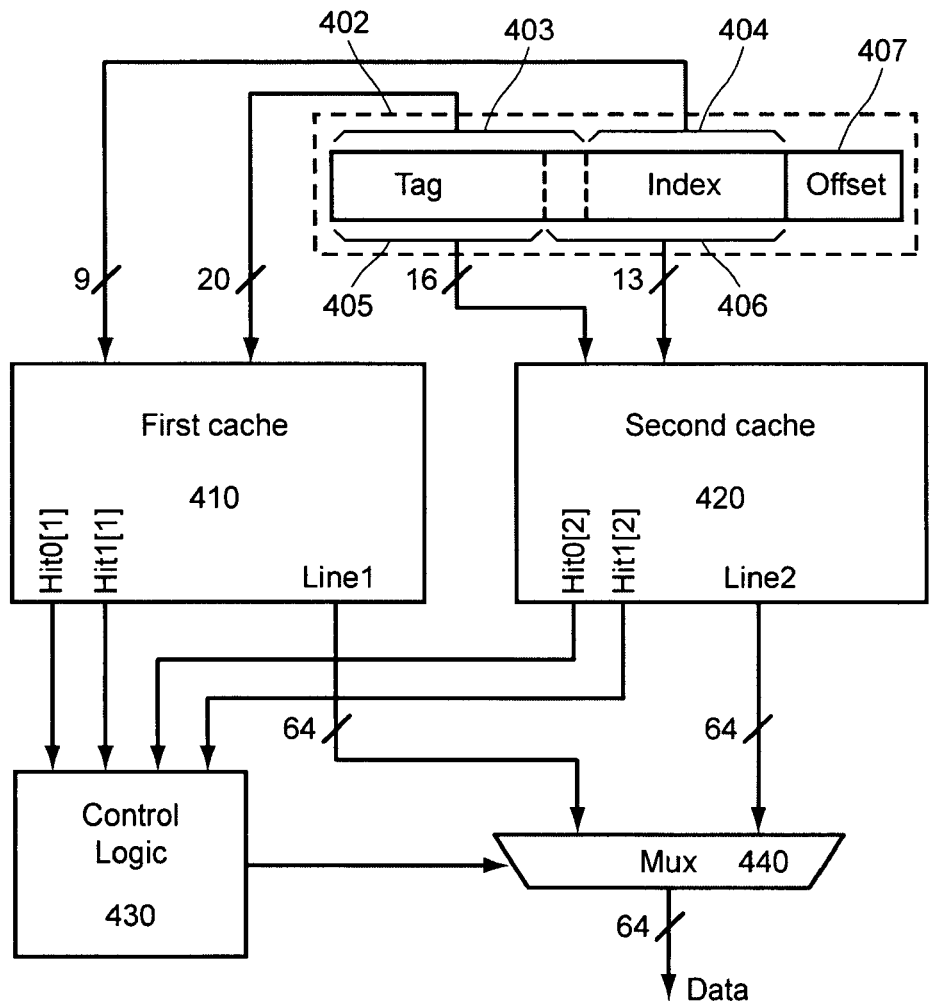
FIG. 4 is a block diagram illustrating a cache memory management system that can access two caches concurrently according to one embodiment of the present invention.

FIG. 4 is a block diagram illustrating a cache memory management system 400 that concurrently accesses two caches according to one embodiment of the present invention. Both a first cache 410 and a second cache 420 may be implemented as the cache 308 shown in FIG. 3. One physical address 402 is checked concurrently against both caches 410 and 420, but the bit fields of the physical address 402 are divided differently for different caches. For illustration purposes, tag bits 403 and index bits 404 for the first cache 410 are 20 bits and 9 bits, respectively, while tag bits 405 and index bits 406 for the second cache 420 are 16 bits and 13 bits, respectively. Offset bits for both the first and second caches are the same and both are 3 bits. Then a tag RAM (not shown) for the first cache 410 may have 1024 (2 9*2=1024) lines for a two-way set association, and a tag RAM (also not shown) for the second cache 420 may have 8K (2 13*2=8K) lines for a two-way set association. Since the size of the tag RAMs are relatively small, so that both tag RAMs for the first and second caches may actually reside in the same core chip for faster checking.

Because different bit fields of the physical address 402 are used by different caches 410 and 420, the same physical address can reach completely different line of tag RAMs with totally different tags, in such a way, the two caches 410 and 420 can be checked concurrently for data availability by the single physical address 402.

As both the first and second caches 410 and 420 are implemented in two-way set association, two pairs of hit signals, Hit0[1:2] and Hit1[1:2] may be produced between them, and are sent to a control logic circuit 430 which controls a multiplexer 440. If one of the signals Hit0[1] and Hit1[1] is hit, then the multiplexer 440 will output a chunk of line[1] data from the first cache 410. Similarly, if one of the signals Hit0[2] and Hit1[2] is hit, then the multiplexer 440 will output a chunk of line[2] data from the second cache 420.

Although only two-way set association is described here, one having skill in the art would recognize that any other way set association may work with the present invention.

Referring to FIG. 4, the first cache 410 may be a cache internal to a core chip, and the second cache 420 may be a cache external to the core chip. The external cache 420 may employ a signal bit, EScache_enable (external shared cache enable), to turn on the external cache and its tag RAM access when the signal is set, and to ignore the external cache when this signal bit is not set.

There should be internal/external cache placement algorithms to prevent both caches 410 and 420 from storing the same line. One embodiment is to use random replacement, namely, the physical address is randomized through LFSR (Linear Feedback Shift Register) algorithm to generate a bit. Select internal cache occurs when this bit is set or external if not set. Another embodiment is to use a portion of physical addresses to determine accessing internal or external caches. For example, according to the physical address, the lowest 8 KB in a page will be assigned to internal cache. Others will be assigned to external cache.

Since off-chip memories have longer inter-connects to a mother die, a stacked cache may be slower than an on-die cache. Therefore, the stacked cache may need longer latency than the on-die cache.

The controls of stacked caches remain better on die, while the stacked memory only provides additional data storage. The tag for the stacked memory may or may not be on die, though it makes more sense to remain on die due to the number of logic involved in cache operations. With this concurrent accessing method, there is more freedom in the way of building a SiP chip.

Figure 5A:
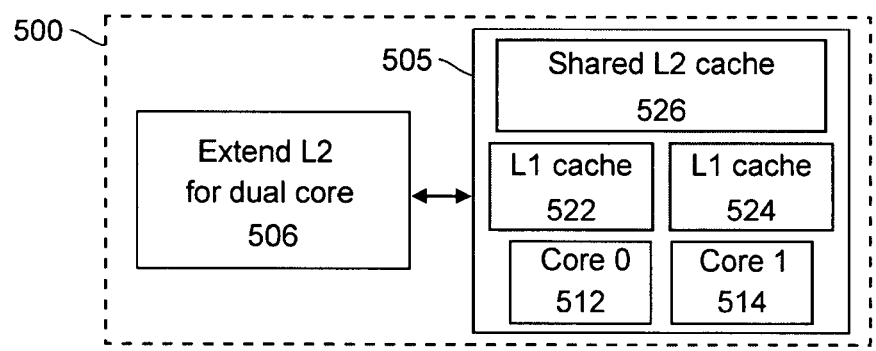
FIGS. 5A and 5B are block diagrams illustrating various ways of stacking shared caches for multicore systems.
Figure 5B:
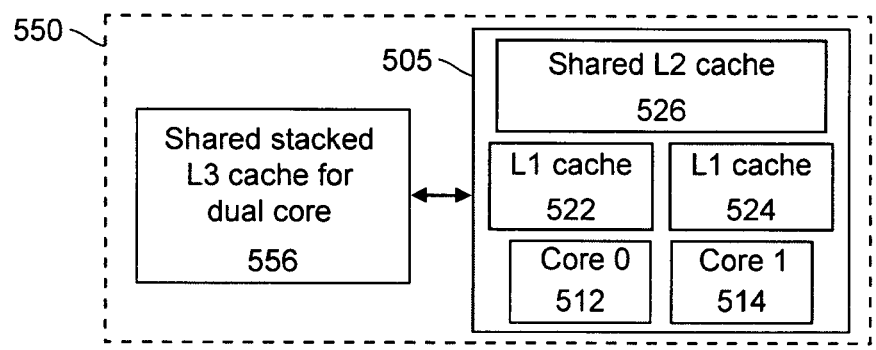

FIGS. 5A and 5B are block diagrams illustrating various ways of stacking shared caches for multicore systems. For illustration purpose, FIGS. 5A and 5B present only dual core systems. One having skill in the art would recognize that the present invention is not limited by the number of cores in a SiP system. In fact, the number of shared caches in the SiP system is not limiting as well.

Referring to FIG. 5A, a stacked SiP 500 contains two dies, a dual core die 505 and a cache die 506. The dual core die 505 has dual cores 512 and 514, dual Level 1 caches 522 and 524 for the dual cores 512 and 514, respectively. The cache die 506 serves as an extended Level 2 cache for the dual cores 512 and 514. In most of today's multi-core computer system, Level 1 and Level 2 caches are typically on the same die as the core central processing units (CPUs). Stacked dies are more applicable to Level 3 cache.

Referring to FIG. 5B, a stacked SiP 550 also contains two dies, a dual core die 505 and a cache die 556 which serves as a shared Level 3 cache for the dual cores 512 and 514. No matter how these caches are organized, according to the present invention described above, all the shared caches may be accessed concurrently.

Figure 6:
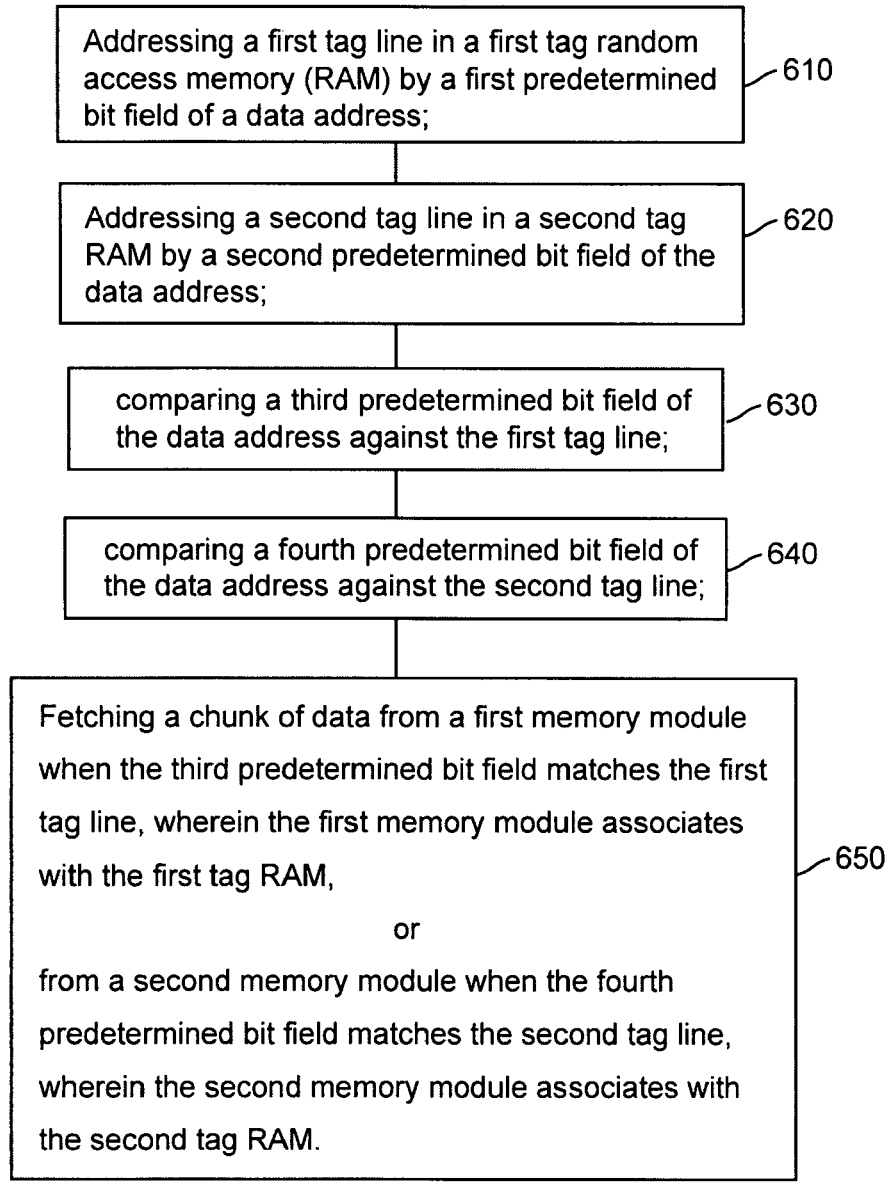
FIG. 6 is a flow chart illustrating a method for concurrently checking data availability in two caches according to another embodiment of the present invention.

FIG. 6 is a flow chart illustrating a method for concurrently checking data availability in two caches according to another embodiment of the present invention. The method begins in step 610, where a processing unit selects a first tag line from a first tag RAM of a first cache, using a first predetermined bit field of a physical address as an address of the first tag. In step 620, the processing unit concurrently selects a second tag line from a second tag RAM of a second cache, using a second predetermined bit field of the physical address as an address of the second tag. Therefore, the first and second predetermined bit fields serve as indexes of the tag RAMs and they may have different number of bits. In step 630, the processing unit checks a third predetermined bit field of the physical address against the first tag line. In step 640, concurrent to the step 630, the processing unit checks a fourth predetermined bit field of the physical address against the second tag line. The third and fourth predetermined bit fields are also called tag fields and may have different number of bits as well. Then, as shown in step 650, the processing unit will fetch a chunk of data the physical address is intended to address from a first memory module when the third predetermined bit field matches the first tag line, wherein the first memory module associates with the first tag RAM. Alternatively, the processing unit will fetch a chunk of data the physical address is intended to address from a second memory module when the fourth predetermined bit field matches the second tag line, wherein the second memory module associates with the second tag RAM. According to the embodiment of the present invention, the first and second memory modules may be two separated and independent memory units. For instance, the first memory module may be a Level 1 or Level 2 cache, and the second memory module may be a Level 3 cache in a stacked die. Nevertheless, data availability in the first and second memory modules may be checked concurrently, hence increasing data access speeds.

Although the present disclosure uses cache memories as an embodiment of the present invention, one having skill in the art would appreciate the present invention can be applied to memory systems where multiple modules exist and tags are used for keeping track of the data stored in the modules.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

The invention claimed is:

1. A system for use in a system-in-package device (SiP), the system comprising:
    a first cache memory of Level 1 on a first die of the SiP, the first cache memory implemented in a multiple-way set association and including a first tag random access memory (RAM) with a tag RAM array for each set, for storing one or more tags corresponding to data stored in the corresponding sets of the first cache memory;
    a second cache memory of a level different from Level 1, the second cache memory implemented in a multiple-way set association and including a first portion of the second cache memory on the first die of the SiP, and a second portion of the second cache memory on a second die of the SiP, the first portion of the second cache memory including a data RAM, the second cache memory including a second tag RAM with a tag RAM array for each set, for storing one or more tags corresponding to data stored in the corresponding sets of the second cache memory;
    a control logic circuit coupled to the first and second cache memories and configured to control a multiplexer for outputting data from either of the first and second cache memories;
    wherein the first and second cache memories are coupled to a single physical address,
    wherein the single physical address is divided into a first number of tag bits, a second number of index bits, and a third number of offset bits associated with the first tag RAM of the first cache memory;
    wherein the single physical address is divided into a fourth number of tag bits, a fifth number of index bits, and a sixth number of offset bits associated with the second tag RAM of the second cache memory,
    wherein one of a first ratio of the first number to the second number and a second ratio of the fourth number to the fifth number is greater than one, and the other of the first and second ratios is greater than two; and
    wherein the first number of tag bits and the second number of index bits of the single physical address provided to the first tag RAM of the first cache memory are different from the fourth number of tag bits and the fifth number of index bits provided to the second tag RAM of the second cache memory, such that both the first cache memory of Level 1and the second cache memory can be checked concurrently for data availability by the single physical address; and
    a processor coupled to the first cache memory and second cache memory and configured to:
        randomize a write-physical-address associated with data-to-store to generate a cache memory selection bit;
        select a write-cache-memory from the first and second cache memories based on the cache memory selection bit; and
        store the data-to-store at the write-physical-address in the write-cache-memory.

2. The system of claim 1, wherein the first cache memory is a 3-way set association cache memory.

3. The system of claim 1, wherein the tag RAM arrays for the first tag RAM are identical.

4. The system of claim 1, wherein the first die further includes a processor.

5. The system of claim 4, wherein the processor is a multi-core processor.

6. The system of claim 1, wherein the first number is different from the fourth number, and wherein the third number is the same as the sixth number.

7. The system of claim 1, wherein the second number is different from the fifth number.

8. The system of claim 1, wherein the second die is stacked on the first die.

9. The system of claim 1, wherein the first or second tag RAMs further comprises one or more attribute bits for memory coherent operations.

10. A system for use in a system-in-package device (SiP), the system comprising:
a first cache memory of Level 1 on a first die of the SiP, the first cache memory including a first tag random access memory (RAM) with multiple identical tag RAM arrays, for storing one or more tags corresponding to data stored in different sets of the first cache memory;
a second cache memory of a level different from Level 1, the second cache memory including a first portion of the second cache memory on the first die of the SiP, and a second portion of the second cache memory on a second die of the SiP, the first portion of the second cache memory including a data RAM, the second cache memory including a second tag RAM with multiple identical tag RAM arrays for storing one or more tags corresponding to data stored in the different sets of the second cache memory; and
a control logic circuit coupled to the first and second cache memories and configured to control a multiplexer for outputting data from either of the first and second cache memories;
wherein the first and second cache memories are separate modules, but are coupled to a single physical address,
wherein the single physical address is divided into a first number of tag bits, a second number of index bits, and a third number of offset bits associated with the first tag RAM of the first cache memory;
wherein the single physical address is divided into a fourth number of tag bits, a fifth number of index bits, and a sixth number of offset bits associated with the second tag RAM of the second cache memory,
wherein one of a first ratio of the first number to the second number and a second ratio of the fourth number to the fifth number is greater than one, and the other of the first and second ratios is greater than two,
wherein the third number is equal to the sixth number, and
wherein the first number of tag bits and the second number of index bits of the single physical address provided to the first tag RAM of the first cache memory are different from the fourth number of tag bits and the fifth number of index bits provided to the second tag RAM of the second cache memory, such that both the first cache memory of Level 1and the second cache memory can be checked concurrently for data availability by the single physical address; and
a processor coupled to the first cache memory and second cache memory and configured to:
randomize a write-physical-address associated with data-to-store to generate a cache memory selection bit;
select a write-cache-memory from the first and second cache memories based on the cache memory selection bit; and
store the data-to-store at the write-physical-address in the write-cache-memory.

11. The system of claim 10, wherein the first cache memory is a 3-way set association cache memory.

12. The system of claim 10, wherein the first die further includes the processor.

13. The system of claim 12, wherein the processor is a multi-core processor.

14. The system of claim 10, wherein the first number is different from the fourth number.

15. The system of claim 10, wherein the second number is different from the fifth number.

16. The system of claim 10, wherein the second die is stacked on the first die.

17. The system of claim 10, wherein the first or second tag RAMs further comprises one or more attribute bits for memory coherent operations.

18. A system for use in a system-in-package device (SiP) including a dual-core processor, the system comprising:
a first cache memory of Level 1 on a first die of the SiP, the first cache memory implemented in a multiple-way set association and including a first tag random access memory (RAM) with at least two identical tag RAM arrays, for storing one or more tags corresponding to data stored in different sets of the first cache memory;
a second cache memory of a level different from Level 1, the second cache memory implemented in a multiple-way set association and including a first portion of the second cache memory on the first die of the SiP, and an extension portion of the second cache memory on a second die of the SiP, the first portion of the second cache memory including a data RAM, the second cache memory including a second tag RAM with at least two identical tag RAM arrays for storing one or more tags corresponding to data stored in the different sets of the second cache memory;
a control logic circuit coupled to the first and second cache memories and configured to control a multiplexer for outputting data from either of the first and second cache memories; and
wherein the first and second cache memories are coupled to a single physical address,
wherein the second cache memory is a shared cache for the dual-core processor,
wherein the single physical address is divided into a first number of tag bits, a second number of index bits, and a third number of offset bits associated with the first tag RAM of the first cache memory;
wherein the single physical address is divided into a fourth number of tag bits, a fifth number of index bits, and a sixth number of offset bits associated with the second tag RAM of the second cache memory,
wherein one of a first ratio of the first number to the second number and a second ratio of the fourth number to the fifth number is greater than one, and the other of the first and second ratios is greater than two,
wherein the third number is equal to the sixth number, and
wherein the first number of tag bits and second number of index bits of the physical address provided to the first tag RAM of the first cache memory are different from the fourth number of tag bits and fifth number of index bits provided to the second tag RAM of the second cache memory, such that both the first cache memory of Level 1and the second cache memory can be checked concurrently for data availability by the single physical address;

wherein the processor is configured to:
  randomize a write-physical-address associated with data-to-store to generate a cache memory selection bit; and
  select a write-cache-memory from the first and second cache memories based on the cache memory selection bit for storing the data-to-store.

19. The system of claim 18, wherein the second die is stacked on the first die.

20. The system of claim 18, wherein the first cache memory is a 3-way set association cache memory.

* * * * *